United States Patent
Cao et al.

(10) Patent No.: US 12,457,809 B2
(45) Date of Patent: Oct. 28, 2025

(54) IMAGING SYSTEMS WITH IMAGE SENSORS HAVING MULTIPLE RADIATION DETECTORS

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 222 days.

(21) Appl. No.: 18/239,970

(22) Filed: Aug. 30, 2023

(65) Prior Publication Data

US 2023/0411433 A1    Dec. 21, 2023

Related U.S. Application Data

(63) Continuation of application No. PCT/CN2021/082514, filed on Mar. 24, 2021.

(51) Int. Cl.
*H10F 39/18* (2025.01)
*G01T 1/24* (2006.01)

(52) U.S. Cl.
CPC ........... *H10F 39/1895* (2025.01); *G01T 1/24* (2013.01)

(58) Field of Classification Search
CPC .............................. H10F 39/1895; G01T 1/24
See application file for complete search history.

(56) References Cited

U.S. PATENT DOCUMENTS

| | | | |
|---|---|---|---|
| 5,744,806 A | 4/1998 | Frojd | |
| 6,703,617 B1 | 3/2004 | Spartiotis et al. | |
| 9,389,320 B2 * | 7/2016 | Ogawa | A61B 6/51 |
| 2021/0204889 A1 * | 7/2021 | Jacob | G01T 1/20182 |

FOREIGN PATENT DOCUMENTS

| | | | | |
|---|---|---|---|---|
| CN | 1729579 A | 2/2006 | | |
| CN | 108027448 A | 5/2018 | | |
| CN | 111587387 A | 8/2020 | | |
| CN | 111602071 A | 8/2020 | | |
| JP | 2002058669 A | 2/2002 | | |
| JP | 2003000587 A | 1/2003 | | |
| WO | WO-2008003351 A1 * | 1/2008 | | H04N 25/41 |
| WO | WO-2019144324 A1 * | 8/2019 | | G01T 1/243 |
| WO | 2020142978 A1 | 7/2020 | | |

* cited by examiner

*Primary Examiner* — Casey Bryant
(74) *Attorney, Agent, or Firm* — IPro, PLLC

(57) ABSTRACT

Disclosed herein is an imaging system, comprising: an image sensor which comprises: a system printed circuit board (system PCB); M group printed circuit boards (group PCBs (i), i=1, . . . , M) mounted on a mounting surface of the system PCB; and Ni radiation detectors mounted on the group PCB (i), for i=1, . . . , M, wherein M and Ni, i=1, . . . , M are integers greater than 1, wherein the image sensor is configured to scan a scene in a scanning direction, and wherein, for each group PCB (i), there is not a plane which (A) is parallel to a normal direction of the mounting surface of the system PCB, (B) is parallel to the scanning direction, (C) divides all active areas of the Ni radiation detectors into 2 groups of active areas, and (D) does not intersect any active area of all the active areas of the Ni radiation detectors.

20 Claims, 9 Drawing Sheets

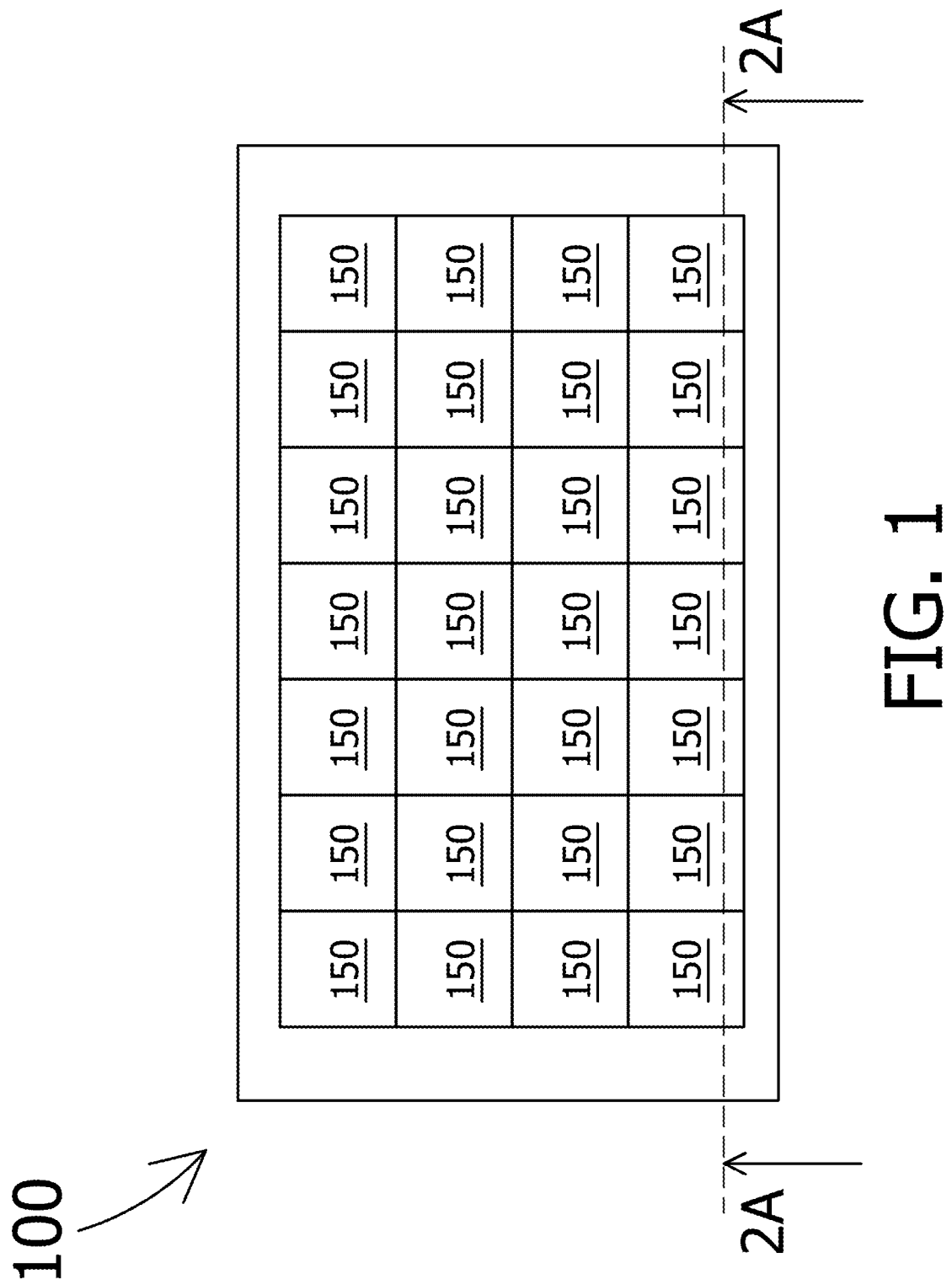

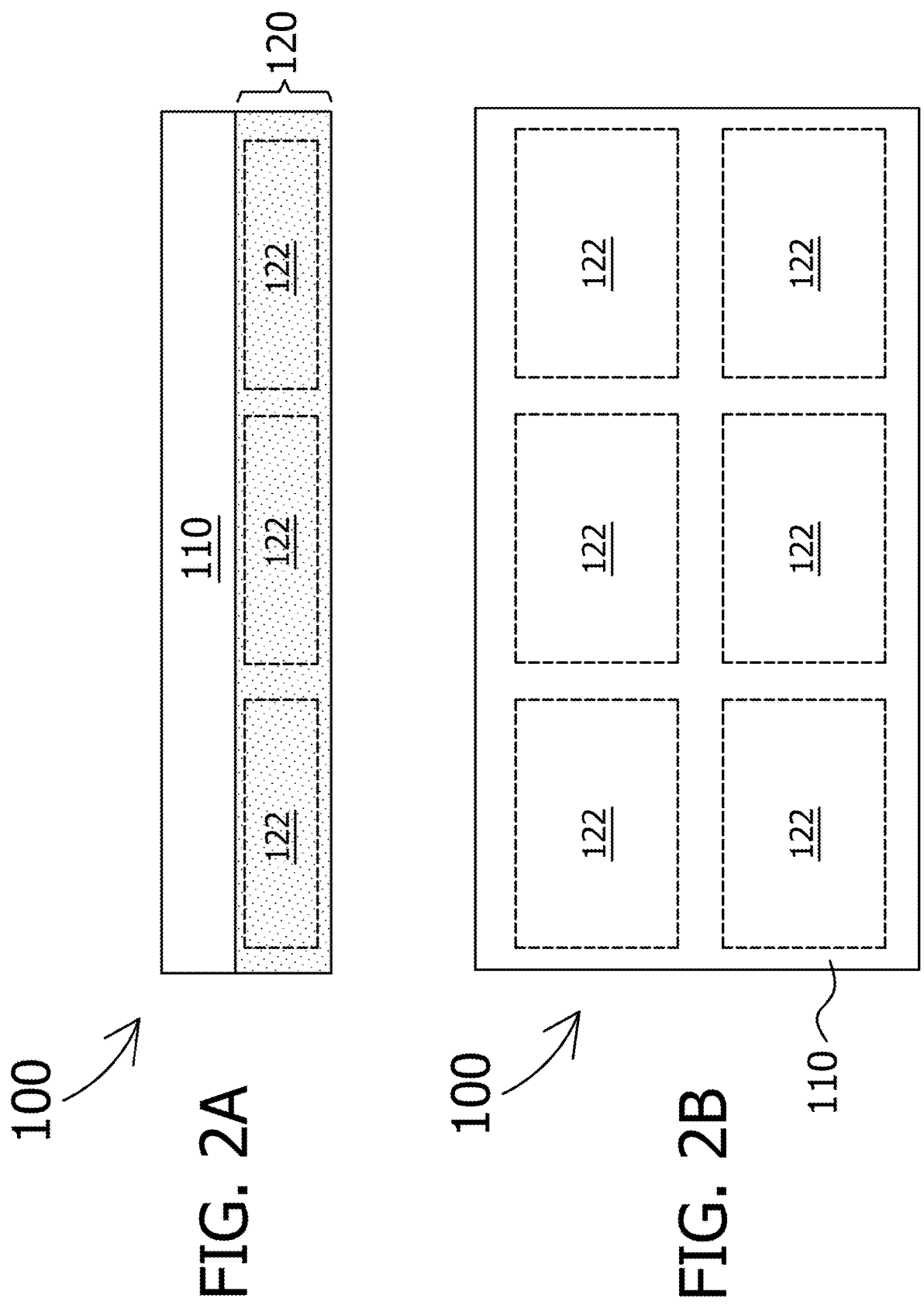

IMAGING SYSTEMS WITH IMAGE SENSORS HAVING MULTIPLE RADIATION DETECTORS

BACKGROUND

A radiation detector is a device that measures a property of a radiation. Examples of the property may include a spatial distribution of the intensity, phase, and polarization of the radiation. The radiation may be one that has interacted with an object. For example, the radiation measured by the radiation detector may be a radiation that has penetrated the object. The radiation may be an electromagnetic radiation such as infrared light, visible light, ultraviolet light, X-ray, or γ-ray. The radiation may be of other types such as α-rays and β-rays. An imaging system may include an image sensor having multiple radiation detectors.

SUMMARY

Disclosed herein is an imaging system, comprising: an image sensor which comprises: a system printed circuit board (system PCB); M group printed circuit boards (group PCBs (i), i=1, . . . , M) mounted on a mounting surface of the system PCB; and Ni radiation detectors mounted on the group PCB (i), for i=1, . . . , M, wherein M and Ni, i=1, . . . , M are integers greater than 1, wherein the image sensor is configured to scan a scene in a scanning direction, and wherein, for each group PCB (i), there is not a plane which (A) is parallel to a normal direction of the mounting surface of the system PCB, (B) is parallel to the scanning direction, (C) divides all active areas of the Ni radiation detectors into 2 groups of active areas, and (D) does not intersect any active area of all the active areas of the Ni radiation detectors.

In an aspect, all Ni, i=1, . . . , M are the same.

In an aspect, the M group PCBs and the system PCB comprise a semiconductor.

In an aspect, each of the M group PCBs has a shape of a rectangle.

In an aspect, the M group PCBs are arranged in a row extending in the scanning direction.

In an aspect, all active areas of all the Ni radiation detectors, i=1, . . . , M overlap in the normal direction such that all the active areas of all the Ni radiation detectors, i=1, . . . , M form one piece of active area in the normal direction.

In an aspect, the imaging system further comprises a radiation source configured to generate a radiation beam whose boundary does not intersect any active area of all active areas of the Ni radiation detectors, i=1, . . . , M as the image sensor scans the scene.

In an aspect, radiation of the radiation beam aims at each and every point of all the active areas of all the Ni radiation detectors, i=1, . . . , M.

In an aspect, the imaging system further comprises a mask which allows some radiation of the radiation source to pass through the mask resulting in the radiation beam.

In an aspect, for each group PCB (i), i=1, . . . , M, no two active areas of the Ni radiation detectors overlap in the normal direction.

In an aspect, for each group PCB (i), i=1, . . . , M, (A) the Ni radiation detectors of the group PCB (i) overlap in the normal direction such that all active areas of the Ni radiation detectors form one piece of active area in the normal direction, and (B) a plane parallel to the normal direction and perpendicular to the scanning direction intersects all active areas of the Ni radiation detectors.

In an aspect, the M group PCBs overlap in the normal direction such that all the M group PCBs form one piece of printed circuit board in the normal direction, and a plane parallel to the normal direction and parallel to the scanning direction intersects all the M group PCBs.

In an aspect, the imaging system further comprises an input/output port on each of the M group PCBs.

In an aspect, an input/output port on a first group PCB of the M group PCBs is sandwiched between the first group PCB and a second group PCB of the M group PCBs.

In an aspect, an input/output port on a first group PCB of the M group PCBs overlaps an active area on a second group PCB of the M group PCBs in the normal direction.

In an aspect, for each group PCB (i), i=1, . . . , M, each radiation detector of the Ni radiation detectors on the group PCB (i) comprises (A) a radiation absorption layer and (B) an electronics layer which comprises multiple application specific integrated circuits (ASICs).

In an aspect, the radiation absorption layer and the electronics layer are electrically connected to each other by vias.

In an aspect, the radiation absorption layer comprises multiple diodes.

In an aspect, the radiation absorption layer comprises a semiconductor.

In an aspect, the electronics layer comprises an electronic system configured for processing signals generated by radiation incident on the radiation absorption layer.

BRIEF DESCRIPTION OF FIGURES

FIG. 1 schematically shows a radiation detector, according to an embodiment.

FIG. 2A & FIG. 2B schematically show a simplified view of the radiation detector, according to an embodiment.

DETAILED DESCRIPTION

Radiation Detector

Figure 2C:
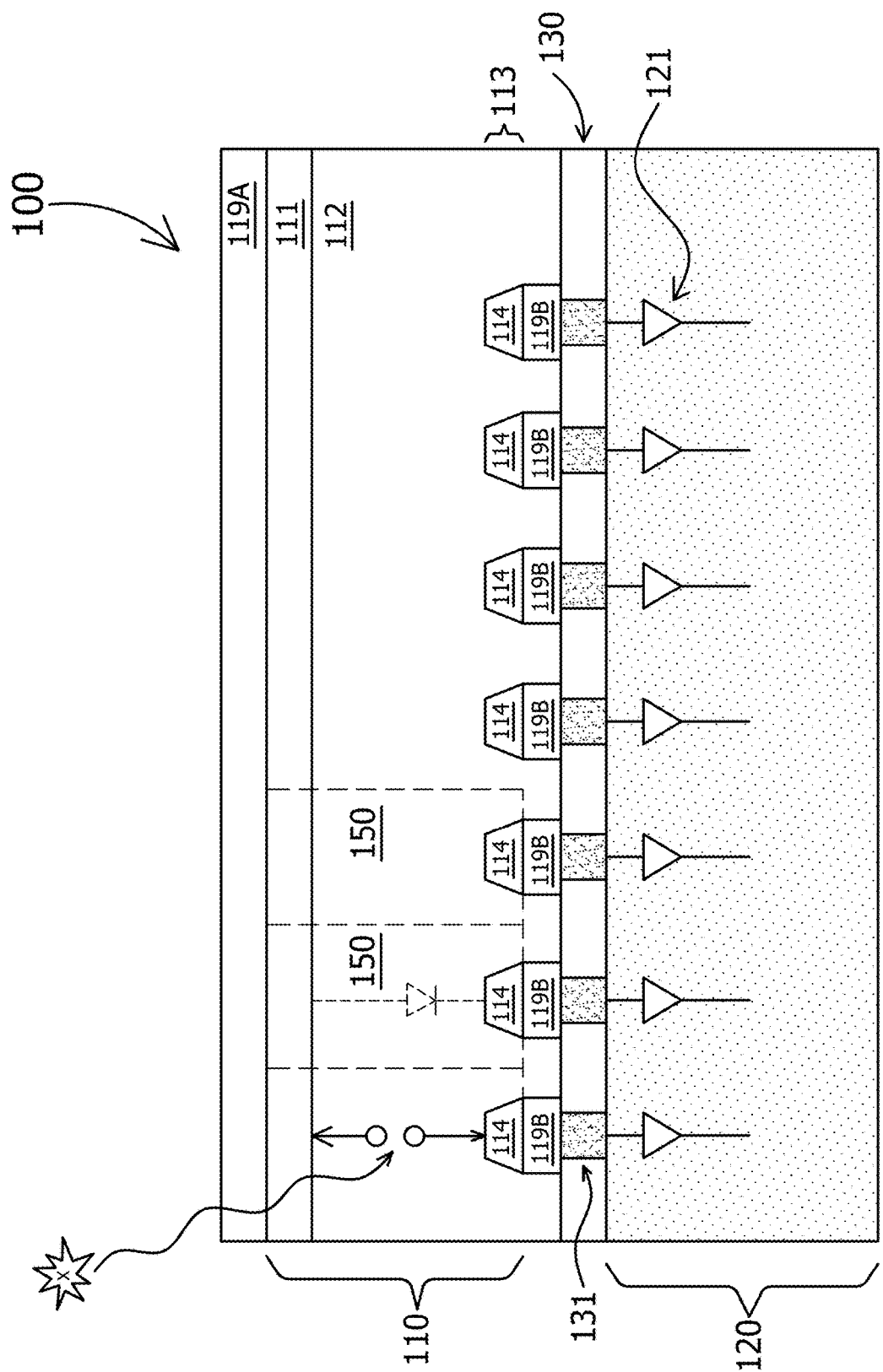
FIG. 2C schematically shows a detailed cross-sectional view of the radiation detector, according to an embodiment.

FIG. 1 schematically shows a radiation detector 100, as an example. The radiation detector 100 may include an array of pixels 150 (also referred to as sensing elements 150). The array may be a rectangular array (as shown in FIG. 1), a honeycomb array, a hexagonal array, or any other suitable array. The array of pixels 150 in the example of FIG. 1 has 4 rows and 7 columns; however, in general, the array of pixels 150 may have any number of rows and any number of columns.

Each pixel 150 may be configured to detect radiation from a radiation source (not shown) incident thereon and may be configured to measure a characteristic (e.g., the energy of the particles, the wavelength, and the frequency) of the radiation. A radiation may include particles such as photons and subatomic particles. Each pixel 150 may be configured to count numbers of particles of radiation incident thereon whose energy falls in a plurality of bins of energy, within a period of time. All the pixels 150 may be configured to count the numbers of particles of radiation incident thereon within a plurality of bins of energy within the same period of time. When the incident particles of radiation have similar energy, the pixels 150 may be simply configured to count numbers of particles of radiation incident thereon within a period of time, without measuring the energy of the individual particles of radiation.

Each pixel 150 may have its own analog-to-digital converter (ADC) configured to digitize an analog signal representing the energy of an incident particle of radiation into a digital signal, or to digitize an analog signal representing the total energy of a plurality of incident particles of radiation into a digital signal. The pixels 150 may be configured to operate in parallel. For example, when one pixel 150 measures an incident particle of radiation, another pixel 150 may be waiting for a particle of radiation to arrive. The pixels 150 may not have to be individually addressable.

The radiation detector 100 described here may have applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this radiation detector 100 in place of a photographic plate, a photographic film, a PSP plate, an X-ray image intensifier, a scintillator, or another semiconductor X-ray detector.

FIG. 2A schematically shows a simplified cross-sectional view of the radiation detector 100 of FIG. 1 along a line 2A-2A, according to an embodiment. More specifically, the radiation detector 100 may include a radiation absorption layer 110 and an electronics layer 120 (e.g., including one or more ASICs 122 or application specific integrated circuits) for processing or analyzing electrical signals which incident radiation generates in the radiation absorption layer 110. The radiation detector 100 may or may not include a scintillator (not shown). The radiation absorption layer 110 may include a semiconductor material such as silicon, germanium, GaAs, CdTe, CdZnTe, or a combination thereof. The semiconductor material may have a high mass attenuation coefficient for the radiation of interest. FIG. 2B schematically shows a top view of the radiation detector 100 of FIG. 2A, according to an embodiment. In FIG. 2B, the electronics layer 120 of the radiation detector 100 may include 6 ASICs 122 as an example. In general, the electronics layer 120 of the radiation detector 100 may include one or more ASICs 122.

FIG. 2C schematically shows a detailed cross-sectional view of the radiation detector 100 of FIG. 1 along the line 2A-2A, as an example. More specifically, the radiation absorption layer 110 may include one or more diodes (e.g., p-i-n or p-n) formed by a first doped region 111, one or more discrete regions 114 of a second doped region 113. The second doped region 113 may be separated from the first doped region 111 by an optional intrinsic region 112. The discrete regions 114 may be separated from one another by the first doped region 111 or the intrinsic region 112. The first doped region 111 and the second doped region 113 may have opposite types of doping (e.g., region 111 is p-type and region 113 is n-type, or region 111 is n-type and region 113 is p-type). In the example of FIG. 2C, each of the discrete regions 114 of the second doped region 113 forms a diode with the first doped region 111 and the optional intrinsic region 112. Namely, in the example in FIG. 2C, the radiation absorption layer 110 has a plurality of diodes (more specifically, 7 diodes corresponding to 7 pixels 150 of one row in the array of FIG. 1, of which only 2 pixels 150 are labeled in FIG. 2C for simplicity). The plurality of diodes may have an electrode 119A as a shared (common) electrode. The first doped region 111 may also have discrete portions.

The electronics layer 120 may include an electronic system 121 suitable for processing or interpreting signals generated by the radiation incident on the radiation absorption layer 110. The electronic system 121 may include an analog circuitry such as a filter network, amplifiers, integrators, and comparators, or a digital circuitry such as a microprocessor, and memory. The electronic system 121 may include one or more ADCs (analog to digital converters). The electronic system 121 may include components shared by the pixels 150 or components dedicated to a single pixel 150. For example, the electronic system 121 may include an amplifier dedicated to each pixel 150 and a microprocessor shared among all the pixels 150. The electronic system 121 may be electrically connected to the pixels 150 by vias 131. Space among the vias may be filled with a filler material 130, which may increase the mechanical stability of the connection of the electronics layer 120 to the radiation absorption layer 110. Other bonding techniques are possible to connect the electronic system 121 to the pixels 150 without using the vias 131.

When radiation from the radiation source (not shown) hits the radiation absorption layer 110 including diodes, particles of the radiation may be absorbed and generate one or more charge carriers (e.g., electrons, holes) by a number of mechanisms. The charge carriers may drift to the electrodes of one of the diodes under an electric field. The electric field may be an external electric field. The electrical contact 119B may include discrete portions each of which is in electrical contact with the discrete regions 114. The term "electrical contact" may be used interchangeably with the word "electrode." In an embodiment, the charge carriers may drift in directions such that the charge carriers generated by a single particle of the radiation are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a particle of the radiation incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a particle of the radiation incident therein flow to the discrete region 114. Namely, less than 2%, less than 1%, less than 0.1%, or less than 0.01% of these charge carriers flow beyond the pixel 150.

Figure 2D:
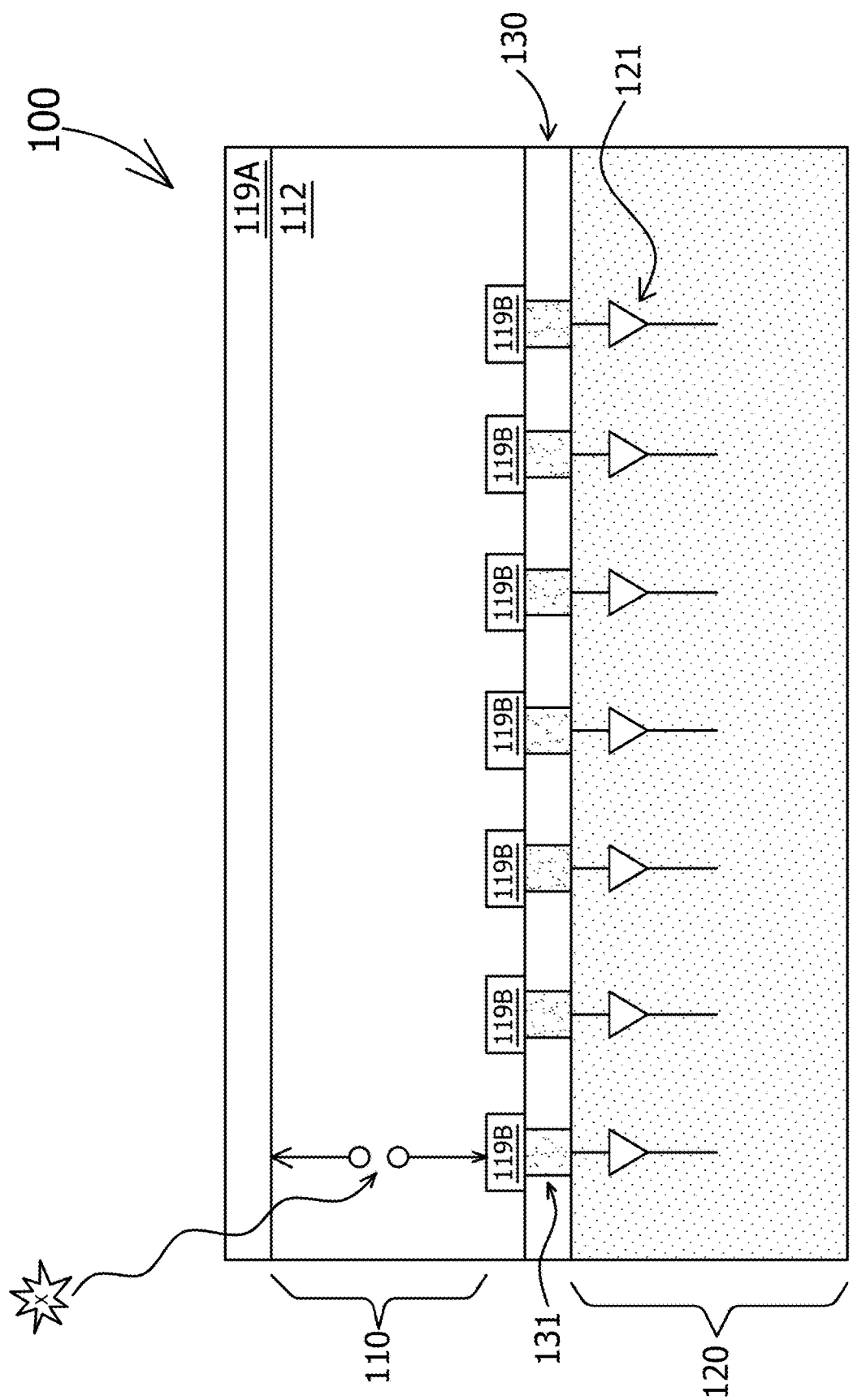
FIG. 2D schematically shows a detailed cross-sectional view of the radiation detector, according to an alternative embodiment.

FIG. 2D schematically shows a detailed cross-sectional view of the radiation detector 100 of FIG. 1 along the line 2A-2A, according to an alternative embodiment. More specifically, the radiation absorption layer 110 may include a resistor of a semiconductor material such as silicon, germanium, GaAs, CdTe, CdZnTe, or a combination thereof, but does not include a diode. The semiconductor material may have a high mass attenuation coefficient for the radiation of interest. In an embodiment, the electronics layer 120 of FIG. 2D is similar to the electronics layer 120 of FIG. 2C in terms of structure and function.

When the radiation hits the radiation absorption layer 110 including the resistor but not diodes, it may be absorbed and generate one or more charge carriers by a number of mechanisms. A particle of the radiation may generate 10 to 100,000 charge carriers. The charge carriers may drift to the electrical contacts 119A and 119B under an electric field. The electric field may be an external electric field. The electrical contact 119B may include discrete portions. In an embodiment, the charge carriers may drift in directions such that the charge carriers generated by a single particle of the radiation are not substantially shared by two different discrete portions of the electrical contact 119B ("not substantially shared" here means less than 2%, less than 0.5%, less than 0.1%, or less than 0.01% of these charge carriers flow to a different one of the discrete portions than the rest of the charge carriers). Charge carriers generated by a particle of the radiation incident around the footprint of one of these discrete portions of the electrical contact 119B are not substantially shared with another of these discrete portions of the electrical contact 119B. A pixel 150 associated with a discrete portion of the electrical contact 119B may be an area around the discrete portion in which substantially all (more than 98%, more than 99.5%, more than 99.9% or more than 99.99% of) charge carriers generated by a particle of the radiation incident therein flow to the discrete portion of the electrical contact 119B. Namely, less than 2%, less than 0.5%, less than 0.1%, or less than 0.01% of these charge carriers flow beyond the pixel associated with the one discrete portion of the electrical contact 119B.

Radiation Detector Package

Figures 3A, 3B, 3C:
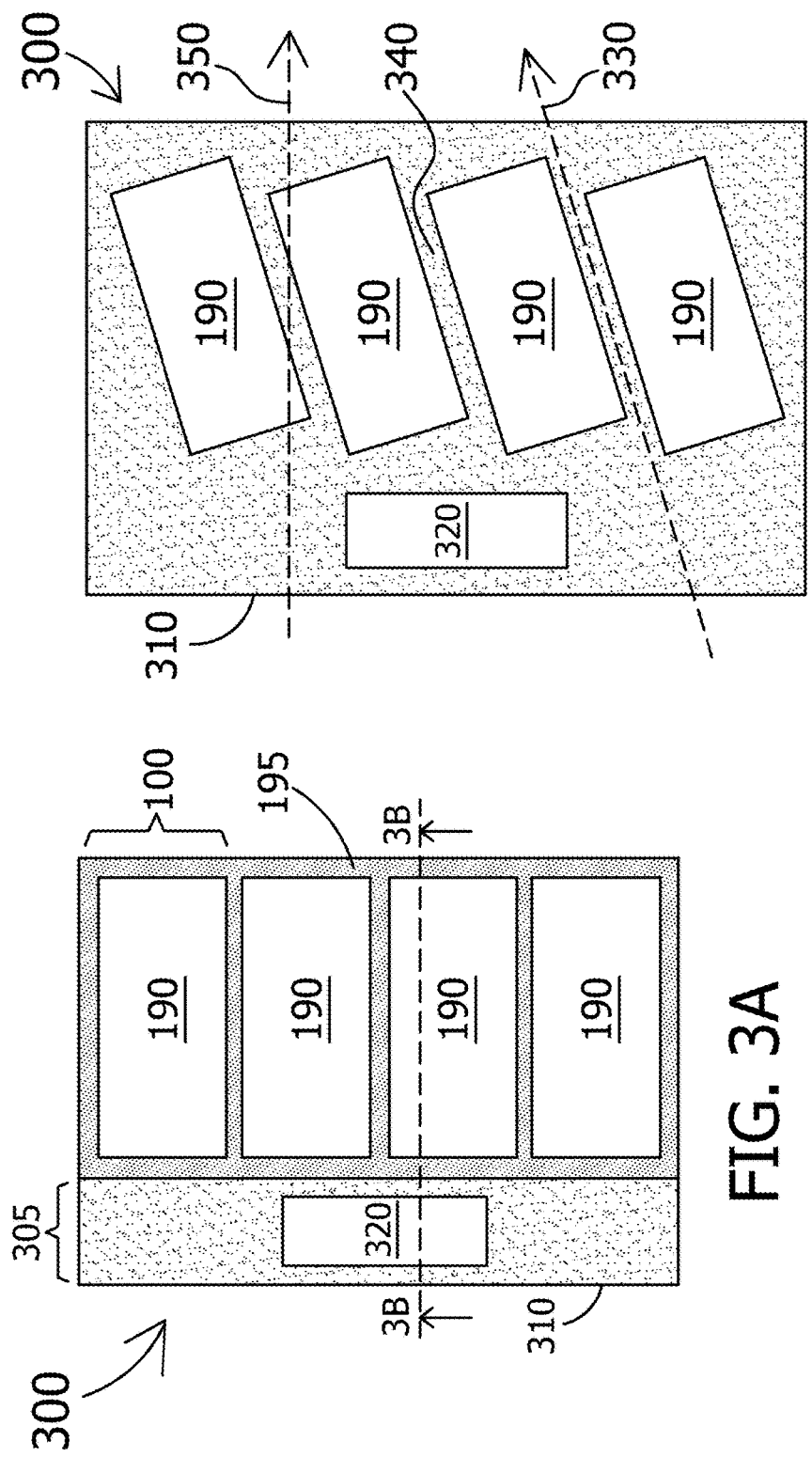
FIG. 3A-FIG. 3C schematically show a radiation detector package including multiple radiation detectors, according to different embodiments.

FIG. 3A schematically shows a top view of a radiation detector package 300, according to an embodiment. Specifically, the radiation detector package 300 may include a group printed circuit board (group PCB) 310 and 4 radiation detectors 100 mounted on the group PCB 310. In general, the radiation detector package 300 may include any number of radiation detectors 100. The term "PCB" as used herein is not limited to a particular material. For example, a PCB may include a semiconductor. The wiring between the 4 radiation detectors 100 and the group PCB 310 is not shown for the sake of clarity. The group PCB 310 may have the shape of a rectangle. In general, the group PCB 310 may have any shape.

The group PCB 310 may have an area 305 not covered by the radiation detectors 100 (e.g., for accommodating an input/output port 320). Each radiation detector 100 of the radiation detector package 300 may have an active area 190 which is where the pixels 150 (FIG. 1) are located. Each radiation detector 100 of the radiation detector package 300 may have a perimeter zone 195 near its edges. The perimeter zones 195 of the radiation detectors 100 have no pixels 150 and therefore do not detect particles of radiation incident thereon. FIG. 3B schematically shows a cross-sectional view of the radiation detector package 300 of FIG. 3A along a line 3B-3B, according to an embodiment.

In an embodiment, the radiation detectors 100 of FIG. 3A may be rotated counterclockwise resulting in the radiation detector package 300 of FIG. 3C. In FIG. 3C, for the radiation detectors 100, only their active areas 190 are shown for simplicity.

Image Sensor

Figure 4A:
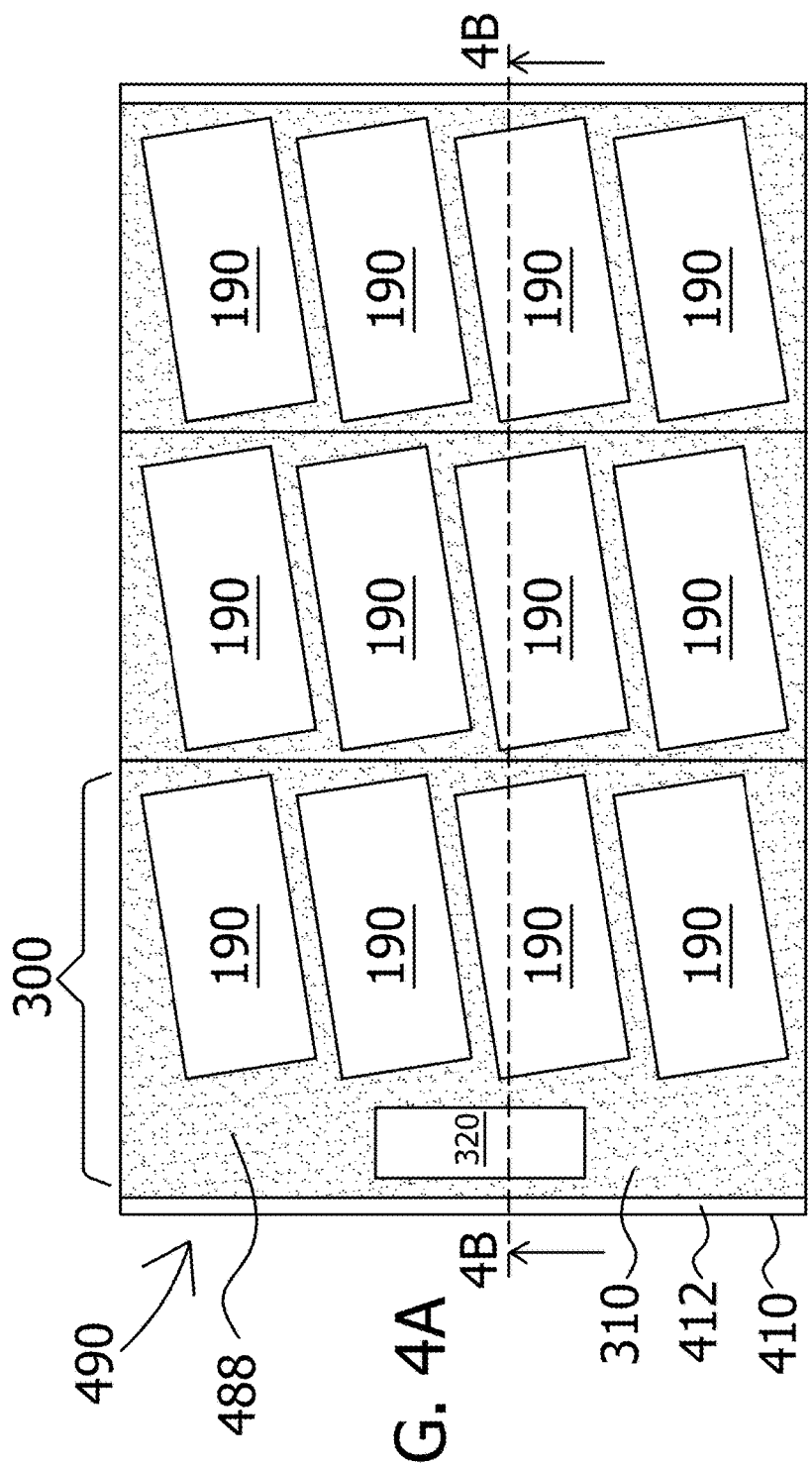
FIG. 4A & FIG. 4B schematically show an image sensor including multiple radiation detector packages, according to an embodiment.

FIG. 4A schematically shows a top view of an image sensor 490, according to an embodiment. Specifically, the image sensor 490 may include a system PCB 410 and 3 radiation detector packages 300 of FIG. 3C mounted on a mounting surface 412 of the system PCB 410. In general, the image sensor 490 may include any number of radiation detector packages 300, and each radiation detector package 300 may have any number of radiation detectors 100. In other words, the numbers of radiation detectors 100 in the radiation detector packages 300 do not have to be the same. For simplicity, only the active areas 190 of the radiation detectors 100 are shown. The electrical connections between the system PCB 410 and the 3 radiation detector packages 300 are not shown for clarity.

In an embodiment, as shown in FIG. 4A, the active areas 190 of each radiation detector package 300 of the image sensor 490 may not overlap in a normal direction (not shown) which is perpendicular to the mounting surface 412 of the system PCB 410. In other words, for each radiation detector package 300 of the image sensor 490, no two active areas 190 of the radiation detectors 100 of the radiation detector package 300 overlap in the normal direction. In FIG. 4A, the mounting surface 412 is parallel to the page; and the normal direction is perpendicular to the page.

Figure 4B:
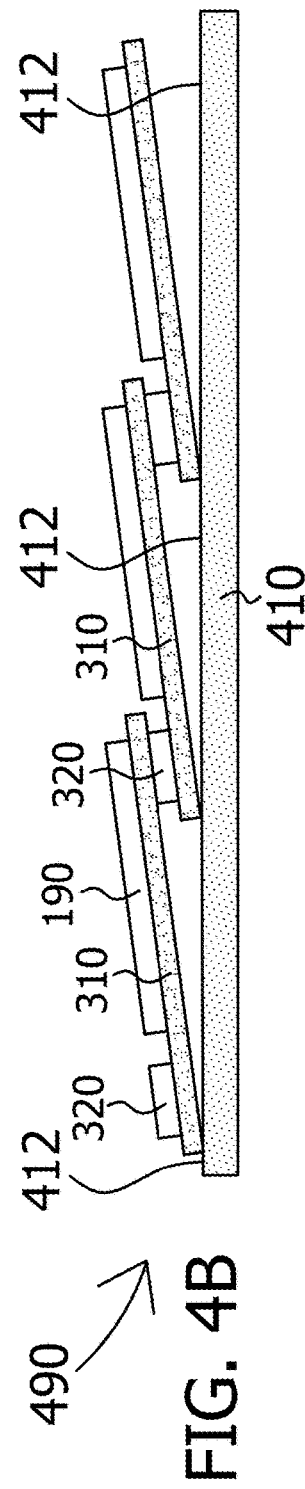

In an embodiment, the 3 radiation detector packages 300 may overlap in the normal direction as shown in FIG. 4A & FIG. 4B. Specifically, the left part of the middle radiation detector package 300 (including the input/output port 320) may be under the left radiation detector package 300 and is not shown for simplicity. Similarly, the left part of the right radiation detector package 300 (including the input/output port 320) may be under the middle radiation detector package 300 and is not shown for simplicity. FIG. 4B schematically shows a cross-sectional view of the image sensor 490 of FIG. 4A along a line 4B-4B, according to an embodiment.

In an embodiment, with reference to FIG. 4A & FIG. 4B, a dead zone 488 of the image sensor 490 may include any area of the image sensor 490 not covered by the active areas 190 of the radiation detectors 100. The dead zone 488 is incapable of detecting incident radiation. However, the image sensor 490 may capture one by one multiple partial images of an object or scene (not shown), and then these captured partial images may be stitched to form a complete image of the object or scene.

In an embodiment, the image sensor 490 may be translated (i.e., moved so that all parts the image sensor 490 travel in the same direction, without rotation or change of shape) as the image sensor 490 scans (i.e., captures one by one multiple partial images of) an object or scene. This direction of translation movement of the image sensor 490 can be referred to as the scanning direction. In an embodiment, as shown in FIG. 4A, the image sensor 490 may be configured to scan in the east direction (i.e., the 3 o'clock direction) and the 3 group PCBs 310 may be arranged in a row extending in the scanning direction (i.e., in the east direction).

In an embodiment, as shown in FIG. 4A & FIG. 4B, the 3 group PCBs 310 may overlap in the normal direction such that all the 3 group PCBs 310 form one piece of printed circuit board in the normal direction and such that a plane (not shown) parallel to the normal direction and parallel to the scanning direction (i.e., the east direction) intersects all the 3 group PCBs 310. Here, the group PCBs 310 forming one piece of printed circuit board in the normal direction means that there is no gap among them when viewed along the normal direction.

In an embodiment, as shown in FIG. 4B, the input/output port 320 on the middle group PCB 310 may be sandwiched between the middle group PCB 310 and the left group PCB 310. In an embodiment, as shown in FIG. 4B, the input/output port 320 on the middle group PCB 310 may overlap an active area 190 on the left group PCB 310 in the normal direction.

In summary and generalization, described above is an image sensor (e.g., the image sensor 490 of FIG. 4A & FIG. 4B) which includes (A) a system PCB (e.g., the system PCB 410), (B) M group PCBs including group PCBs (i), i=1, . . . , M (e.g., group PCB (1), group PCB (2), and group PCB (3) of FIG. 4A & FIG. 4B) mounted on a mounting surface (e.g., the mounting surface 412) of the system PCB, and (C) Ni radiation detectors mounted on the group PCB (i), for i=1, . . . , M (e.g., N1=4 radiation detectors 100 are mounted on the group PCB (1); N2=4 radiation detectors 100 are mounted on the group PCB (2); and N3=4 radiation detectors 100 are mounted on the group PCB (3)).

In addition, in an embodiment, the image sensor may be configured to scan a scene in a scanning direction (e.g., the scanning direction may be eastward, that is in the 3 o'clock direction).

In addition, for each group PCB (i) (e.g., group PCB (1), group PCB (2), and group PCB (3) of FIG. 4A & FIG. 4B), there is not a plane which (A) is parallel to a normal direction (e.g., the direction perpendicular to the page of FIG. 4A) of the mounting surface of the system PCB, (B) is parallel to the scanning direction (e.g., eastward), (C) divides all active areas of the Ni radiation detectors (e.g., the 4 active areas 190) into 2 groups of active areas, and (D) does not intersect any active area of all the active areas of the Ni radiation detectors. This condition (i.e., there is not a plane which . . . ) ensures that the active areas 190 of each radiation detector package 300 of the image sensor 490 can sweep through an area without leaving any unswept regions in the area, as the image sensor 490 scans the scene in the scanning direction.

This can be illustrated with reference to FIG. 3C as follows. If the scanning direction is in the 2 o'clock direction (arrow 330), then the gaps 340 between the 4 active areas 190 of the radiation detector package 300 would result in unswept regions in the area swept through by the 4 active areas 190. This scenario occurs when the condition mentioned above (i.e., there is not a plane which . . . ) is not met. Alternatively, if the scanning direction is in the 3 o'clock direction (arrow 350), then there would be no unswept regions in the area swept through by the 4 active areas 190. This alternative scenario occurs when the condition mentioned above (i.e., there is not a plane which . . . ) is met.

Figure 4C:
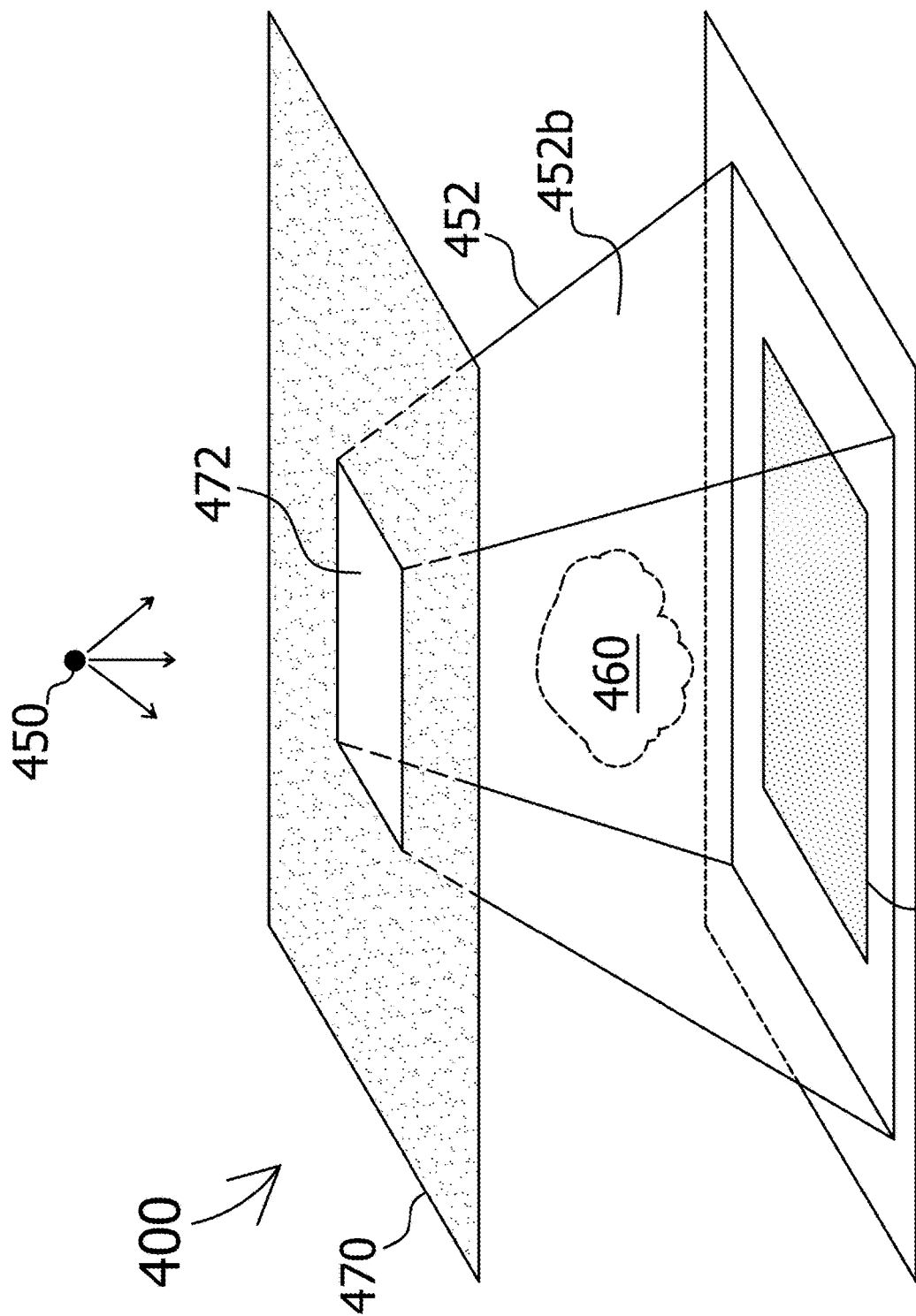
FIG. 4C schematically shows a perspective view of an imaging system, according to an embodiment.

FIG. 4C schematically shows a perspective view of an imaging system 400, according to an embodiment. Specifically, the imaging system 400 may include the image sensor 490 of FIG. 4A & FIG. 4B, a radiation source 450, and a mask 470. In FIG. 4C, details of the image sensor 490 are not shown for simplicity. In an embodiment, of the radiation from the radiation source 450 that is incident on the mask 470, only the radiation that is incident on a mask window 472 of the mask 470 is allowed to pass through the mask 470 resulting in a radiation beam 452 with a beam boundary 452b.

In an embodiment, the imaging system 400 may be arranged such that the beam boundary 452b of the radiation beam 452 does not intersect any active area 190 of all the active areas 190 of the image sensor 490 as the image sensor 490 scans the scene (which may include an object 460). In an embodiment, as shown in FIG. 4C, the radiation of the radiation beam 452 may aim at each and every point of all the active areas 190 of the image sensor 490. In other words, each and every point of all the active areas 190 of the image sensor 490 is targeted by the radiation beam 452.

Figure 5:
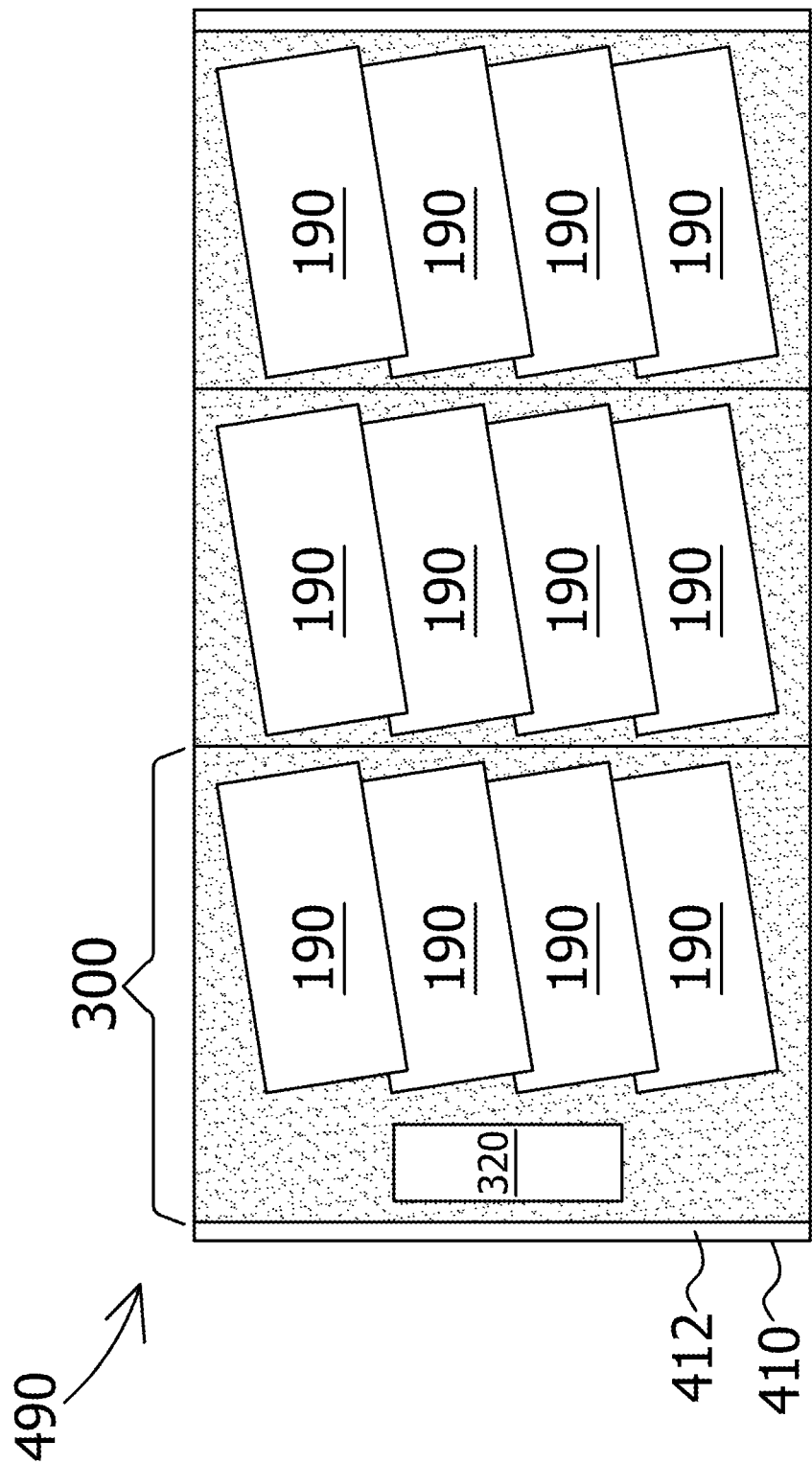
FIG. 5 shows the image sensor of FIG. 4A & FIG. 4B, according to an alternative embodiment.

In an embodiment, with reference to FIG. 5, in each of the 3 radiation detector packages 300 of the image sensor 490, the active areas 190 may overlap in the normal direction. In an embodiment, the active areas 190 of each radiation detector package 300 of the image sensor 490 may overlap such that all the active areas 190 of each radiation detector package 300 form one piece of active area in the normal direction as shown in FIG. 5. Here, all the active areas 190 forming one piece of active area in the normal direction means that there is no gap among the active areas 190 when viewed along the normal direction. In an embodiment, in addition, as shown in FIG. 5, for each radiation detector package 300 of the image sensor 490, a plane (not shown) parallel to the normal direction and perpendicular to the scanning direction intersects all the active areas 190 of the radiation detectors 100 of the radiation detector package 300.

Figure 6:
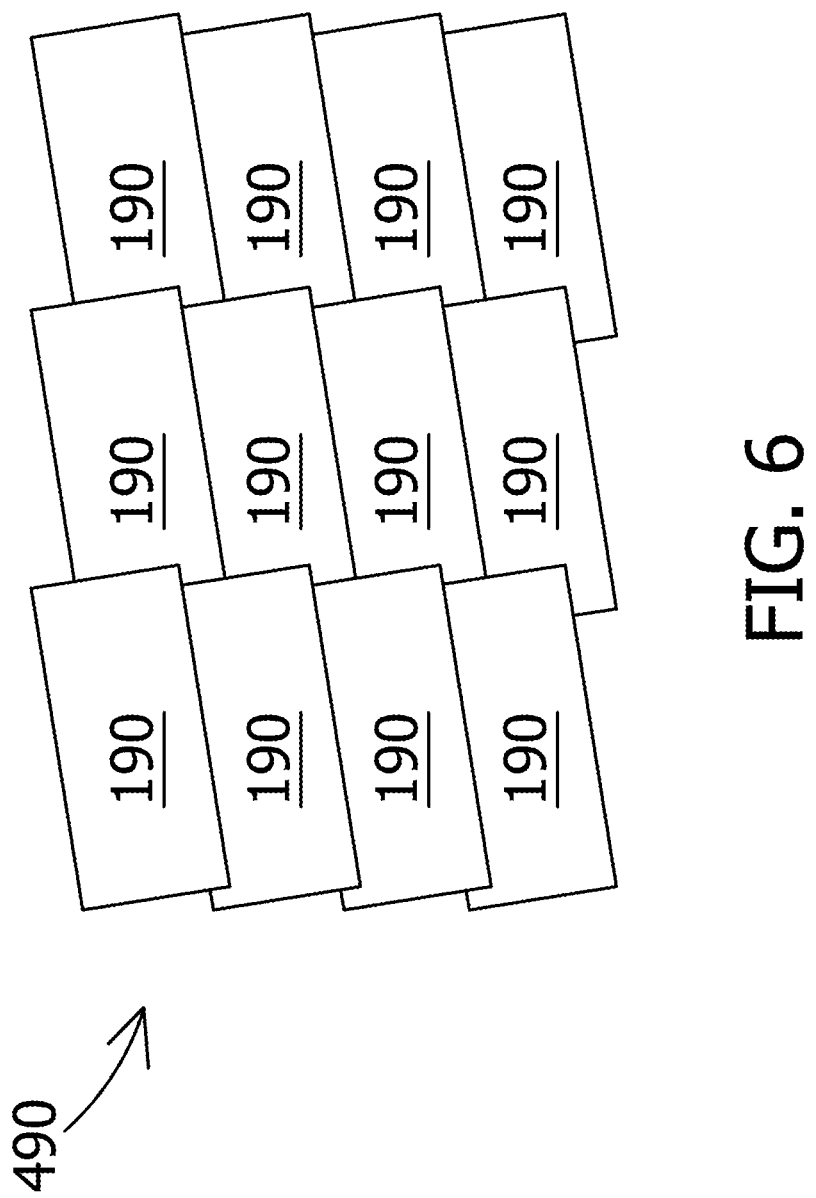
FIG. 6 shows the image sensor of FIG. 4A & FIG. 4B, according to yet another alternative embodiment.

In an embodiment, the 3 radiation detector packages 300 of FIG. 5 may be arranged closer together resulting in the image sensor 490 of FIG. 6. In FIG. 6, only the active areas 190 of the 3 radiation detector packages 300 of the image sensor 490 are shown for simplicity. In an embodiment, all the 12 active areas 190 of the 3 radiation detector packages 300 form one piece of active area in the normal direction as shown in FIG. 6.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:
1. An imaging system, comprising:
an image sensor which comprises:
 a system printed circuit board (system PCB);
 M group printed circuit boards (group PCBs (i), i=1, . . . , M) mounted on a mounting surface of the system PCB; and
 Ni radiation detectors mounted on the group PCB (i), for i=1, . . . , M,
wherein M and Ni are integers greater than 1,
wherein the image sensor is configured to scan a scene in a scanning direction, and
wherein, for each group PCB (i), there is not a plane which (A) is parallel to a normal direction of the mounting surface of the system PCB, (B) is parallel to the scanning direction, (C) divides all active areas of the Ni radiation detectors into 2 groups of active areas, and (D) does not intersect any active area of all the active areas of the Ni radiation detectors.

2. The imaging system of claim 1, wherein all Ni, i=1, . . . , M are the same.

3. The imaging system of claim 1, wherein the M group PCBs and the system PCB comprise a semiconductor.

4. The imaging system of claim 1, wherein each of the M group PCBs has a shape of a rectangle.

5. The imaging system of claim 1, wherein the M group PCBs are arranged in a row extending in the scanning direction.

6. The imaging system of claim 1, wherein all active areas of all the Ni radiation detectors, i=1, . . . , M overlap in the normal direction such that all the active areas of all the Ni radiation detectors, i=1, . . . , M form one piece of active area in the normal direction.

7. The imaging system of claim 1, further comprising a radiation source configured to generate a radiation beam whose boundary does not intersect any active area of all active areas of the Ni radiation detectors, i=1, . . . , M as the image sensor scans the scene.

8. The imaging system of claim 7, wherein radiation of the radiation beam aims at each and every point of all the active areas of all the Ni radiation detectors, i=1, ..., M.

9. The imaging system of claim 7, further comprising a mask which allows some radiation of the radiation source to pass through the mask resulting in the radiation beam.

10. The imaging system of claim 1, wherein, for each group PCB (i), i=1, ..., M, no two active areas of the Ni radiation detectors overlap in the normal direction.

11. The imaging system of claim 1, wherein, for each group PCB (i), i=1, ..., M, (A) the Ni radiation detectors of the group PCB (i) overlap in the normal direction such that all active areas of the Ni radiation detectors form one piece of active area in the normal direction, and (B) a plane parallel to the normal direction and perpendicular to the scanning direction intersects all active areas of the Ni radiation detectors.

12. The imaging system of claim 1,
wherein the M group PCBs overlap in the normal direction such that all the M group PCBs form one piece of printed circuit board in the normal direction, and
wherein a plane parallel to the normal direction and parallel to the scanning direction intersects all the M group PCBs.

13. The imaging system of claim 12, further comprising an input/output port on each of the M group PCBs.

14. The imaging system of claim 13, wherein an input/output port on a first group PCB of the M group PCBs is sandwiched between the first group PCB and a second group PCB of the M group PCBs.

15. The imaging system of claim 13, wherein an input/output port on a first group PCB of the M group PCBs overlaps an active area on a second group PCB of the M group PCBs in the normal direction.

16. The imaging system of claim 1, wherein for each group PCB (i), i=1, ..., M, each radiation detector of the Ni radiation detectors on the group PCB (i) comprises (A) a radiation absorption layer and (B) an electronics layer which comprises multiple application specific integrated circuits (ASICs).

17. The imaging system of claim 16, wherein the radiation absorption layer and the electronics layer are electrically connected to each other by vias.

18. The imaging system of claim 16, wherein the radiation absorption layer comprises multiple diodes.

19. The imaging system of claim 16, wherein the radiation absorption layer comprises a semiconductor.

20. The imaging system of claim 16, wherein the electronics layer comprises an electronic system configured for processing signals generated by radiation incident on the radiation absorption layer.

* * * * *